United States Patent [19]
Asahina et al.

[11] Patent Number: 6,107,182
[45] Date of Patent: Aug. 22, 2000

[54] SEMICONDUCTOR DEVICE AND METHOD OF FABRICATING THE SAME

[75] Inventors: Michio Asahina, Sakata; Junichi Takeuchi, Chino; Naohiro Moriya, Chino; Kazuki Matsumoto, Chino, all of Japan

[73] Assignee: Seiko Epson Corporation, Tokyo, Japan

[21] Appl. No.: 09/161,920

[22] Filed: Sep. 29, 1998

[30] Foreign Application Priority Data

| | | | |
|---|---|---|---|
| Oct. 2, 1997 | [JP] | Japan | 9-286036 |
| Mar. 3, 1998 | [JP] | Japan | 10-067868 |
| Sep. 9, 1998 | [JP] | Japan | 10-272612 |

[51] Int. Cl.$^7$ ............................................. H01L 21/28
[52] U.S. Cl. ..................... 438/618; 438/622; 438/652; 438/688
[58] Field of Search ................................. 438/618, 396, 438/387, 272, 238, 239, 243, 622, 652, 608

[56] References Cited

U.S. PATENT DOCUMENTS

| | | | |
|---|---|---|---|
| 5,012,309 | 4/1991 | Nakayama | 357/23.6 |
| 5,471,418 | 11/1995 | Tanigawa | 365/149 |
| 5,696,017 | 12/1997 | Ueno | 437/60 |
| 5,858,837 | 1/1999 | Sakoh et al. | 438/255 |

FOREIGN PATENT DOCUMENTS

| | | |
|---|---|---|
| 64-76736 | 3/1989 | Japan . |
| 4-64222 | 2/1992 | Japan . |
| 6-5715 | 1/1994 | Japan . |
| 8-203896 | 8/1996 | Japan . |
| 11-17004 | 1/1999 | Japan . |

*Primary Examiner*—Mary Wilczewski
*Assistant Examiner*—James Park
*Attorney, Agent, or Firm*—Oliff & Berridge, PLC

[57] ABSTRACT

A semiconductor device having a contact structure that can exhibit superlative step coverage without causing voids or wiring discontinuities, using aluminum or aluminum alloys as a conductive substance for via-holes. A method of fabricating the semiconductor device comprises, for at least one layer of wiring regions above the first wiring region on a semiconductor substrate, the following steps (a) to (f): (a) a step of forming a via-hole in a second interlayer dielectric formed above the first wiring region on a semiconductor substrate; (b) a degassing step for removing gaseous components included within the interlayer dielectric by a heat treatment under reduced pressure and at the substrate temperature of 300° C. to 550° C.; (c) a step of forming a wetting layer on the surface of the interlayer dielectric and the via-hole; (d) a step of cooling the substrate to a temperature of no more than 100° C.; (e) a step of forming a first aluminum layer comprising one of aluminum and an alloy in which aluminum is the main component on the wetting layer at a temperature of no more than 200° C.; and (f) a step of forming a second aluminum layer comprising one of aluminum and an alloy in which aluminum is the main component on the first aluminum layer at a temperature of at least 300° C.

5 Claims, 7 Drawing Sheets

SEMICONDUCTOR DEVICE AND METHOD OF FABRICATING THE SAME

BACKGROUND OF THE INVENTION

1. Field of the Invention

The present invention relates to a semiconductor device and a fabrication method therefor, and, in particular, to a semiconductor device that enables microminiaturization and has a contact structure using aluminum, and to a fabrication method therefor.

2. Description of Background Art

In a semiconductor device such as a LSI, recent advances in microminiaturization, integration, and multi-layering of elements have made it necessary to use connection through-holes such as contact holes and via-holes having high aspect ratios. Filling such connection through-holes with wiring materials is very difficult and, therefore, has become an important technical challenge in recent years. In this regard, attempts have been made to fill connection through-holes with aluminum or aluminum alloys that are useful as a wiring material.

One of the techniques intended for the above requirement is disclosed, for example, in Japanese Patent Application Laid-Open No. 64-76736/1989. This discloses a fabrication-method in which aluminum is made to fill connection through-holes in a two-step manner, wherein aluminum or an aluminum alloy is first deposited at a temperature of 150° C. or lower, then a further layer of the aluminum or aluminum alloy is grown by bias sputtering.

With this technique, aluminum layers can be deposited comparatively uniformly into connection through-holes and the coverage performance thereof is improved somewhat. However, this has not improved far enough the problem of discontinuity that occurs at conductive parts within the connection through-holes due to causes such as voids.

SUMMARY OF THE INVENTION

An objective of the present invention is to provide a semiconductor device having a contact structure that can exhibit superlative step coverage without causing any voids or wiring discontinuities, using aluminum or aluminum alloys as a conductive substance for connection through-holes, in particular, for via-holes.

Another objective of the present invention is to provide a method of fabricating such a semiconductor device as described above.

The method of fabricating a semiconductor device of the present invention applies to a semiconductor device comprising a semiconductor substrate including semiconductor elements, and multi-layered wiring regions, wherein at least one layer of the wiring regions above the first wiring region on the semiconductor substrate is fabricated using a process comprising the following steps (a) to (f):

(a) a step of forming a via-hole in an interlayer dielectric formed above the first wiring region on a semiconductor substrate;

(b) a degassing step for removing gaseous components included within the interlayer dielectric by a heat treatment under reduced pressure and at the substrate temperature of 300° C. to 550° C.;

(c) a step of forming a wetting layer on the surface of the interlayer dielectric and the via-hole;

(d) a step of cooling the substrate to a temperature of no more than 100° C.;

(e) a step of forming a first aluminum layer comprising one of aluminum and an alloy in which aluminum is the main component on the wetting layer at a temperature of no more than 200° C.; and (f) a step of forming a second aluminum layer comprising one of aluminum and an alloy in which aluminum is the main component on the first aluminum layer at a temperature of at least 300° C.

One feature of the method of fabricating a semiconductor device in the present invention is the inclusion of the step (b) of removing any gaseous components that may be contained within the interlayer dielectric (the degassing step), performed under specific conditions. The inclusion of this degassing step makes it possible to suppress the generation of gases such as water vapor, nitrogen, hydrogen, or oxygen that may be contained within the interlayer dielectric, during subsequent steps such as the formation of the second aluminum layer under high-temperature conditions of 300° C. or higher. Although there are no specific limitations to the preparation of the interlayer dielectric, a chemical vapor deposition (CVD) film using tetraethoxysilane (TEOS) as a silane compound, a multi-layered film comprising a CVD film of TEOS, spin-on-glass (SOG) coatings and TEOS-CVD films, a silicon oxide film prepared by a polycondensation reaction of a silicon compound and hydrogen peroxide, and the like can be mentioned by way of examples.

The present inventors have confirmed that gases such as those mentioned above generated from the interlayer dielectric are absorbed by the wetting layer but not by the aluminum layers within via-holes. Therefore, if any gaseous components contained within the interlayer dielectric are removed prior to the formation of the aluminum layers in the step (b), deterioration in the wettability of the wetting layer and generation of voids caused by gases lying between the wetting layer and the first aluminum layer can certainly be suppressed. This consequently enables formation of contact regions comprising low-resistance aluminum films with good coverage performance within via-holes.

In the present specification, the term "gaseous components" refers to gases such as water vapor, hydrogen, oxygen, nitrogen, and the like that are generated from the deposited layers, i.e. the interlayer dielectric and the wetting layer, under conditions of a reduced pressure and a substrate temperature of 300° C. or higher. In addition, the term "reduced pressure" refers to a pressure that is preferably no more than 2.6 Pa, or more preferably, no more than 1.3 Pa.

With the method of the present invention, the temperature of the substrate is cooled to 100° C. or lower in the above-mentioned step (d), or preferably to between room temperature and 50° C. This cooling of the substrate temperature in step (d) ensures that the substrate temperature is lowered sufficiently prior to forming the first aluminum layer. Since the previous degassing step (b) is performed at a high substrate temperature exceeding 300° C., lowering the substrate temperature in step (d) ensures that the temperature can be adjusted reliably for the subsequent step (e). Going through the aforementioned steps enables the process to minimize the amount of gases emitted from the interlayer dielectric, wetting layer, and also the entire surface of a wafer during the formation of the first aluminum layer. As a result, the above process can help prevent gases adsorbed at the interface between the wetting layer and the first aluminum layer from adversely affecting the coverage performance and adhesiveness.

By forming the first aluminum layer on the wetting layer in the above-mentioned step (e) at a temperature of no more than 200° C., preferably 30° C. to 100° C., the emission of gaseous components contained within the interlayer dielectric and the wetting layer can be suppressed, thus making it possible to prevent any deterioration in the wettability of the wetting layer caused by the generation of gases from the wetting layer which pass to the outside. As a result, the first aluminum layer can adhere well to the wetting layer, enabling film formation with good step coverage.

The presence of this first aluminum layer makes it possible to suppress the generation of gases from the interlayer dielectric and the wetting layer that underlie the first aluminum layer, even when the temperature of the substrate rises. As a result, the step (f) of forming the second aluminum layer can be performed at a comparatively high temperature, that is, at a temperature high enough for the aluminum or aluminum alloy to flow and diffuse. More specifically, this second aluminum layer can be formed at a temperature of 300° C. or more; preferably 350° C. to 450° C.

As described in the foregoing, by forming the first aluminum layer at a comparatively low temperature in step (e) and then forming the second aluminum layer at a comparatively high temperature in step (f), it becomes possible to fill via-holes with good step coverage but without creating any voids. It has also been confirmed that the fabrication method of the present invention can be applied to via-holes having a diameter of 0.6 $\mu$m or less.

The aluminum layers in the aforementioned steps (e) and (f) are preferably formed by a sputtering method, and it is further preferable that the first aluminum layer and the second aluminum layer are formed in sequence within the same chamber. Forming the aluminum layers in sequence in the same chamber in this manner facilitates control over the substrate temperature and also enables accurate control over the atmosphere, thus making it possible to avoid problems such as the formation of oxide films on the surface of the first aluminum layer. The substrate temperature, additionally, is set by regulating the temperature of the stage on which a semiconductor substrate is being mounted.

Further, the steps (d), (e), and (f) are preferably performed sequentially within the same apparatus having a plurality of chambers and being maintained under a reduced pressure. This helps reduce the number of substrate movements and setting steps, thus simplifying the process and preventing substrate contamination.

A semiconductor device fabricated using the aforementioned method is a semiconductor device comprising a semiconductor substrate including semiconductor elements, and multi-layered wiring regions, wherein at least one layer of the wiring regions above the first wiring region on the semiconductor substrate comprises:

- an interlayer dielectric from which gaseous components have been removed by heat treatment;
- a via-hole formed in the interlayer dielectric;
- a wetting layer formed on the surface of the interlayer dielectric and via-hole; and
- an aluminum layer formed on the wetting layer, and comprising either aluminum or an alloy in which aluminum is the main component.

This semiconductor device is characterized in that it has an interlayer dielectric which has had gaseous components removed therefrom by heat treatment, and, as described above, it has a contact region comprising aluminum layers with good step coverage.

The via-hole in accordance with the present invention could be formed by anisotropic dry etching, or it could equally well be formed into a configuration in which the upper end of a via-hole is formed in an appropriately tapered shape by a combination of isotropic wet etching and anisotropic dry etching. This feature is extremely useful in practical application because it allows the use of a general-purpose sputtering apparatus that does not have a high-temperature capability. Specifically, formation of the second aluminum layer can be accomplished at 300° C. to 350° C., when a via-hole of the above-mentioned type is formed in such a manner that a lower portion thereof is formed by anisotropic dry etching to a diameter of 0.5 to 0.8 $\mu$m, with an aspect ratio of between 0.5 and 3.0.

DETAILED DESCRIPTION OF THE PREFERRED EMBODIMENTS

Figure 1A:
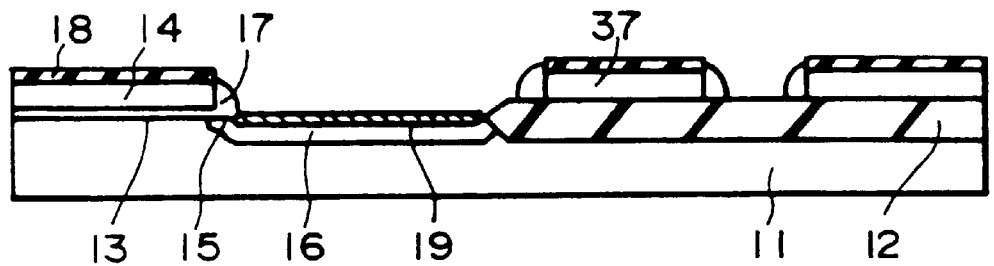
FIGS. 1A to 1C are cross-sectional views schematically showing the processing sequence in an example of the method of fabricating a semiconductor device in accordance with the present invention.
Figure 1B:
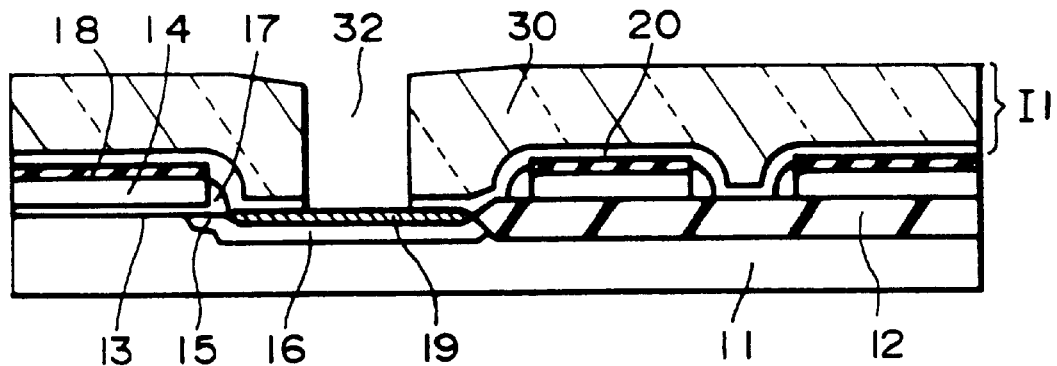
Figure 1C:
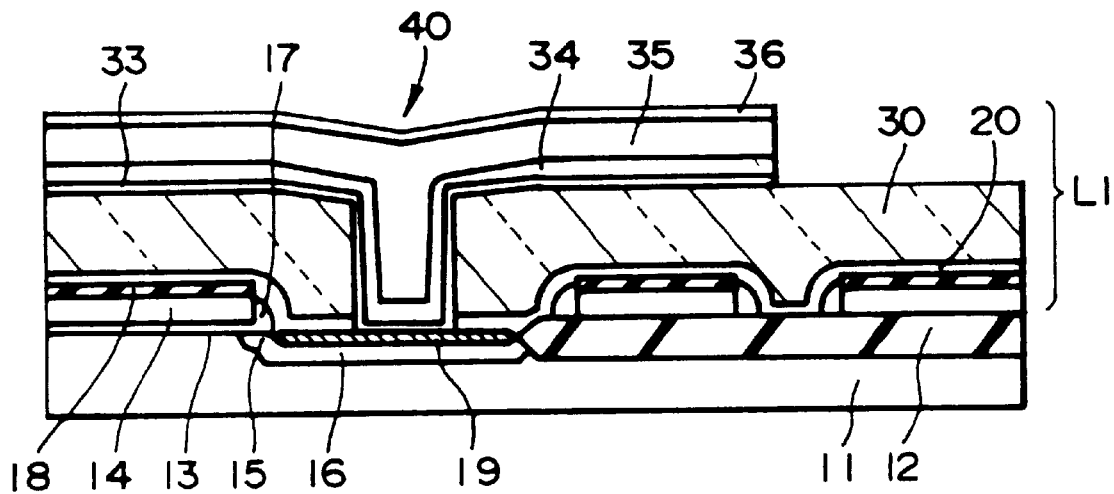
Figure 2A:
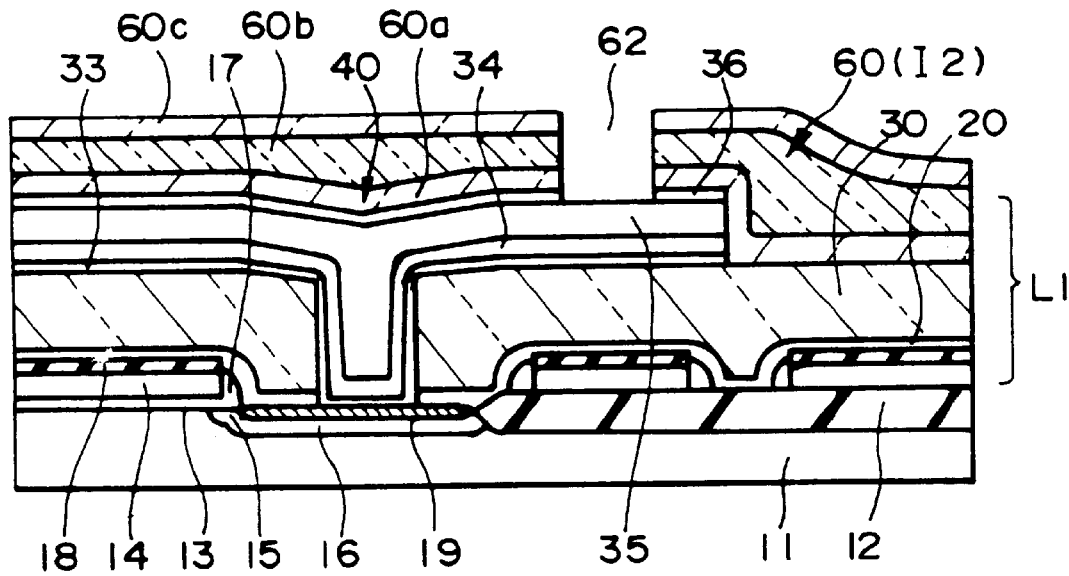
FIGS. 2A and 2B are cross-sectional views schematically showing the processing sequence that follows the above FIG. 1C in an example of the method of fabricating the semiconductor device.
Figure 2B:
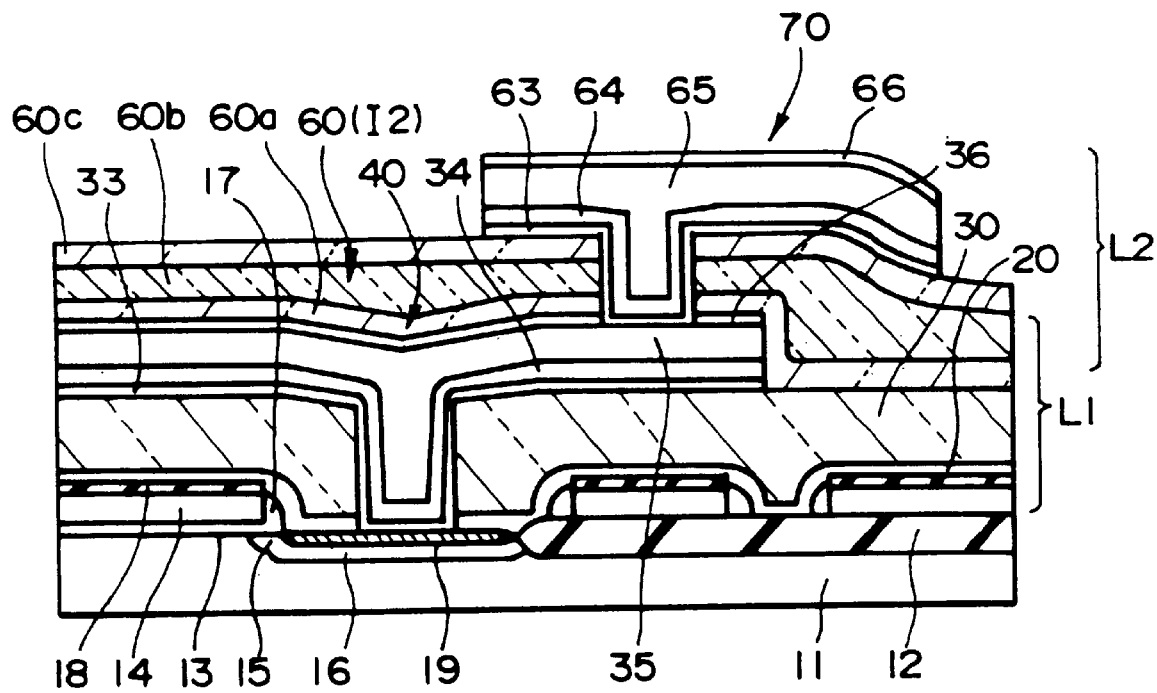

Schematic cross-sectional views that illustrate an embodiment of the method of fabricating a semiconductor device in accordance with the present invention, together with the resultant semiconductor device, are shown in FIGS. 1A to 1C, as well as in FIGS. 2A and 2B. FIGS. 1A to 1C illustrate fabrication steps for providing the first layer of a wiring region L1, whereas FIGS. 2A and 2B are for providing the second layer of a wiring region L2.

An example of the method of fabricating a semiconductor device is described below.

(A) First, fabrication steps are described referring to FIG. 1A.

<Formation of a semiconductor element>

A MOS transistor is first formed on a silicon substrate 11 by a generally used method. More specifically, for example, a field insulation layer 12 is formed on the silicon substrate 11 by selective oxidation and a gate oxide layer 13 is formed in an active region. After the threshold voltage has been adjusted by channel implantation, a polysilicon layer is grown by thermally decomposing monosilane ($SiH_4$), then tungsten silicide is sputtered onto that polysilicon layer. A silicon oxide layer 18 is superimposed thereon, which is then etched to a predetermined pattern to form a gate electrode 14. At the same time, a wiring layer 37 comprising a polysilicon layer and a tungsten silicide layer is formed on the field insulation layer 12, if necessary.

A lightly doped layer 15 for the source or drain region is then formed by a phosphorus ion implantation. After a side-wall spacer 17 comprising silicon oxide layer has been formed on the sides of the gate electrode 14, arsenic ions are implanted, and these impurities are activated by annealing using a halogen lamp to form a heavily doped layer 16 for the source or drain region.

A silicon oxide layer of a thickness of no more than 100 nm is then grown by vapor deposition, and a predetermined silicon substrate region is exposed by selectively etching this layer in a mixed aqueous solution of hydrogen fluoride (HF) and $NH_4F$. Subsequently, a titanium monosilicide layer is formed on the surface of the exposed silicon substrate and a titanium-rich titanium nitride (TiN) layer is formed on the silicon oxide layer 18 by, for example, sputtering a layer of titanium to a thickness of approximately 30 to 100 nm thereon, then performing rapid annealing for approximately a few seconds to 60 seconds at a temperature of 650° C. to 750° C. in a nitrogen atmosphere in which oxygen concentration is controlled to be no more than 50 ppm. The wafer is then immersed in a mixed aqueous solution of ammonium hydroxide ($NH_4OH$) and hydrogen peroxide ($H_2O_2$) to etch away the titanium nitride layer, leaving the titanium monosilicide layer only on the surface of the silicon substrate. Lamp annealing at 750° C. to 850° C. is then performed to convert the monosilicide layer to a disilicide, so that the titanium silicide layer 19 is formed with self-alignment on the surface of the heavily doped layer 16.

Note that if the gate electrode 14 is formed of polysilicon alone and it is exposed by selective etching, a titanium salicide structure is formed where the gate electrode is separated by side-wall spacers from both the source and drain regions.

The salicide structure could be fabricated from tungsten silicide of molybedenum silicide, instead of titanium silicide.

(B) Next, fabrication steps are described referring to FIG. 1B.

<Formation of a first interlayer dielectric>

Next, a silicon oxide layer 20 is formed as a part of the first interlayer dielectric I1 to a thickness of 100 to 200 nm by causing a plasma reaction between tetraethoxysilane (TEOS) and oxygen. This silicon oxide layer 20 forms a dense film having better insulating properties and a slower etching speed under an aqueous hydrogen fluoride solution than a film grown from monosilane ($SiH_4$), without causing any oxidation or cusping of the silicide layer 19.

While the silicon oxide layer 20 is formed directly on the titanium silicide layer 19, if the film-formation temperature is too high during this step, the oxidizing gas will easily react with the titanium silicide in the initial stages of the film formation. Since such reaction makes cracking and peeling likely to occur, the processing temperature is preferably set to 600 ° C. or lower, or more preferably, between 250° C. to 400° C. Once the silicon oxide layer has been formed to a thickness of approximately 100 nm on the titanium silicide layer 19 at this comparatively low temperature, raising the temperature to approximately 900° C. for annealing or dry oxidation performed in a non-steam oxidizing atmosphere will not cause any problems.

A BPSG layer 30 is then formed to a thickness of several hundred nm to 1 $\mu$m on the above-mentioned silicon oxide layer 20 as another part of the first interlayer dielectric I1, by causing a vapor-phase reaction between a silane compound such as $SiH_4$ or TEOS, oxygen or ozone, and a gas containing phosphorus and boron. This layer is subsequently annealed at 800° C. to 900° C. in a nitrogen atmosphere, to planarize it by causing high-temperature flow therein. Note that this planarization of the BPSG layer 30 could also be done by a commonly used method of chemical/mechanical polishing or using a SOG layer technique, instead of the high-temperature flow.

<Formation of a contact hole>

The BPSG layer 30 and the silicon oxide layer 20 that configure the interlayer dielectric are then selectively and anisotropically etched by a reactive ion etcher using $CHF_3$ and $CF_4$ as main gases, to form a contact hole 32 of a diameter of between 0.2 and 0.5 $\mu$m.

(C) Next, fabrication steps are described referring to FIG. 1C.

<Degassing>

Firstly, the heat treatment that includes a degassing step, which is a feature of the present invention, is described below.

The wafer is subjected to a lamp heating (heat treatment A), performed in a lamp chamber for 30 to 60 seconds, at a base pressure of $1 \times 10^{-4}$ Pa or less, and at a temperature of 150° C. to 250° C. Then degassing is performed by heat treatment (degassing step: heat treatment B) for 30 to 120 seconds at a temperature of 300° C. to 550° C. in a separate chamber into which argon is introduced at a pressure of 0.1 to 1.0 Pa.

During the above procedure, the first heat treatment A heats the entire wafer, including the rear and side surfaces thereof, to enable the removal of any moisture or the like adhering to the wafer.

The subsequent heat treatment B makes it possible to remove gaseous components (oxygen, hydrogen, water vapor, and nitrogen), mainly from within the BPSG layer 30 that forms a part of the first interlayer dielectric I1. As a result, the generation of gaseous components from the BPSG layer can be prevented during the subsequent steps of forming the barrier and aluminum layers.

In the present embodiment, a barrier layer 33 is formed of a multi-layer structure comprising a barrier film, which has a barrier function, and a conductive film. The conductive film is formed between the high-resistance barrier film and impurity diffusion layers formed on the silicon substrate, i.e. the source and drain regions, to increase the conductivity between the barrier film and the impurity diffusion layers. As the barrier film, an ordinary substance, for example, nitride such as titanium nitride or cobalt nitride is suitably used. A refractory metal such as titanium, cobalt, or tungsten can be used as the conductive film. Such titanium or cobalt reacts with the silicon constituting the substrate to form a silicide.

Since a barrier layer such as a TiN/Ti film can hold gaseous components (oxygen, hydrogen, water vapor, and nitrogen) in solid solution, which can be as high as several tens of atomic percentage, removing the gaseous components from the BPSG layer 30 of the interlayer dielectric I1 prior to the formation of the barrier layer is extremely effective for forming a good aluminum layer within the contact hole. If the gaseous components in the BPSG layer underlying the barrier layer are not removed sufficiently, the gaseous components within the BPSG layer will be released at the temperature applied during the formation of the barrier layer (usually 300° C. or higher), and these gases will be taken up into the barrier layer. In addition, these gases will be desorbed from the barrier layer and will exit from the interface with the aluminum layer during the formation of the aluminum layer, which will adversely affect the adhesiveness and fluidity of the aluminum layer.

<Formation of a barrier layer>

A titanium layer is formed by sputtering to a thickness of 20 to 70 nm, as the conductive film of the barrier layer 33, then a TiN film is formed in a separate chamber to a thickness of 30 to 150 nm, as the barrier film. The sputtering temperature for the barrier film formation depends on the thickness thereof, and is selected to be within the range of 200° C. to 450° C.

The wafer is then exposed to an oxygen plasma at a pressure of 10 to 100 Pa for 10 to 100 seconds, then it is annealed in a nitrogen or hydrogen atmosphere at 450° C. to 700° C. for 10 to 60 minutes, to form titanium oxide as islands within the barrier layer. It has been verified that this processing improves the performance of the barrier layer.

The aforementioned annealing could also be performed by heat treatment at 400° C. to 800° C. in a lamp annealing furnace with at least several hundred ppm and up to several percent of oxygen concentration, to enable a similar improvement in the performance of the barrier layer.

<Heat treatment before formation of aluminum layers>

Prior to the wafer cooling, heat treatment (heat treatment C) is performed in the lamp chamber for 30 to 60 seconds at a base pressure of $1.5 \times 10^{-4}$ Pa or less and at a temperature of 150° C. to 250° C. to remove substances such as moisture that may be adhering to the substrate.

<Wafer cooling>

Before the aluminum layers are formed, the temperature of the substrate is lowered to below 100° C., preferably to between room temperature and 50° C. This cooling step is important for lowering the substrate temperature that has been raised by the heat treatment C.

By cooling the wafer in the above manner, the amount of gas that escapes from the BPSG layer 30, the barrier layer 33, and all the surfaces of the wafer can be minimized during the formation of the first aluminum layer. Consequently, the above process can help prevent gases adsorbed in the interface between the barrier layer 33 and the first aluminum layer from adversely affecting the coverage performance and adhesiveness.

This cooling step is preferably performed by making use of the same sputtering apparatus that is used for forming the aluminum films which has a plurality of chambers of the same configuration. For example, the substrate is preferably placed on a stage equipped with a water-cooling function that is provided within the chamber, to cool the substrate to a given temperature. This cooling step is described in detail below.

Figure 3A:
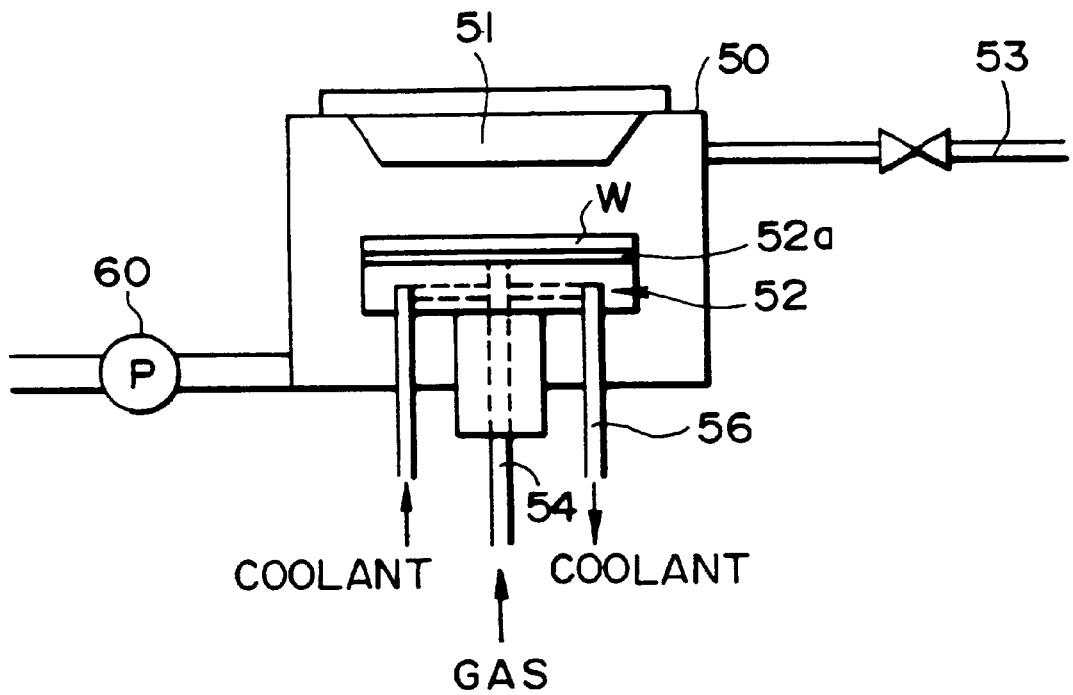
FIG. 3A is a schematic view of an example of the sputtering apparatus used in the present embodiment of the invention and FIG. 3B is a plan view of an example of the stage thereof.
Figure 3B:
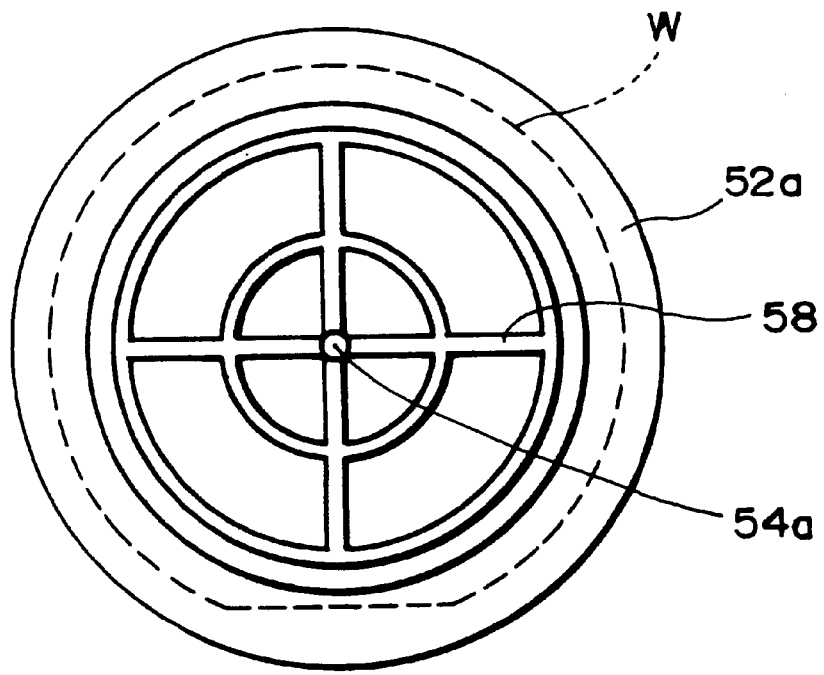

An example of a chamber comprising a stage that has a water-cooling function is shown schematically in FIG. 3A and a plan view of an example of this stage is shown in FIG. 3B.

The sputtering apparatus is provided with a plurality of chambers 50, all of the same configuration. Each chamber 50 is configured with a target 51 that also acts as an electrode and an electrode 52 that also acts as a stage, wherein a substrate (wafer) W to be cooled is placed upon the electrode 52. The chamber 50 is provided with an exhaust device 60 for evacuating the chamber and a first gas supply line 53 for supplying a gas to the chamber when aluminum sputtering is performed. The electrode 52 is configured in such a manner that a given space is formed between the electrode 52 and the wafer W when the wafer W is mounted on the electrode 52. More specifically, a protruding support 52a is provided around an outer periphery of the upper surface of the electrode 52, as shown in FIG. 3B. A second gas supply line 54 is also connected to the electrode 52. A gas that acts as a heat transfer medium, such as argon, is supplied from the second gas supply line 54 into the space between the electrode 52 and the wafer W. Thus the electrode 52 also acts as a cooling system for cooling the wafer W. The temperature of the electrode 52 is controlled at a fixed level by a circulation of a coolant such as water from a coolant supply line 56. To ensure that gas is supplied uniformly to the above-mentioned space, grooves 58 are prepared in the upper surface of the electrode 52, for example as shown in FIG. 3B, and an outlet 54a of the second gas supply line 54 is provided at a position at which the grooves intersect.

The aforementioned sputtering apparatus operates as described below to cool the wafer.

The interior of the chamber 50 is held under vacuum of $6 \times 10^{-6}$ Pa or less by the exhaust device 60 and the wafer W is mounted on the support 52a of the electrode 52. The gas that is to act as a heat transfer medium between the electrode 52 and the wafer W is introduced into the space between the electrode 52 and the wafer W from the second gas supply line 54, the pressure in this space is held at 600 to 1000 Pa, and the wafer W is cooled while the gas that escapes from this space is evacuated by the exhaust device 60.

When cooling the wafer W, a certain pressure is required within the space between the electrode 52 and the wafer W to ensure cooling efficiency. In other words, it is necessary to raise the thermal conductance between the electrode 52 and the wafer W to improve the efficiency with which the wafer W is cooled. This necessitates an increased pressure for the gas (heat transfer medium) in the space between the electrode 52 and the wafer W.

Another method that could be considered for cooling the wafer is to mount the wafer on a stage that has a cooling mechanism within a vacuum chamber. With such a cooling process, no gas is supplied directly into the space between the stage and the wafer, and the pressure within the space depends on the chamber pressure. Accordingly, it is necessary to increase the chamber pressure to increase the pressure in the space between the stage and the wafer. However, if the chamber pressure is raised for cooling efficiency, the quantity of gas molecules within the chamber will increase proportionately, inviting a situation where the upper surface of the wafer is prone to contamination by the gas molecules. This adversely affects the reflow of aluminum and can also lead to generation of voids as well as an increase in the wiring resistance. Conversely, if the chamber pressure is reduced to prevent contamination of the wafer, the pressure in the space between the wafer and the stage will drop, lowering the thermal conductance between the wafer and the stage and, consequently, harming the cooling efficiency.

With the cooling step of the present embodiment, the gas is allowed to flow between the electrode 52 and the rear surface of the wafer W, which maintains the pressure in the space between the electrode 52 and the wafer W, permitting the pressure in this space to be controlled independently of the chamber pressure. Therefore, even after ensuring that there is a sufficient quantity of heat transfer medium between the wafer and the stage, the chamber pressure can be restricted to between $1 \times 10^{-3}$ and 0.1 Pa, independently of the pressure within the above space. This ensures that the contamination of the upper surface of the wafer by gas molecules is prevented and, consequently, improves the reflow characteristics of the aluminum and reduces the resistance thereof. Since the pressure in the aforementioned space can be set to within the range of 600 to 1,300 Pa without increasing the chamber pressure, the thermal conductance can be improved to increase the cooling efficiency. Accordingly, the cooling step of the present embodiment makes it possible to reduce the pressure in the chamber while maintaining the pressure in the space between the wafer W and the electrode 52 high, thereby accomplishing a good cooling efficiency while preventing contamination of the wafer.

<Formation of aluminum layers>

A film of aluminum containing 0.2 to 1.0 wt. % of copper is first formed at a high speed by sputtering to a thickness of 150 to 300 nm at a temperature no more than 200° C., more preferably 30° C. to 100° C., to form a first aluminum layer 34. The substrate is then heated within the same chamber to between 350° C. and 460° C., and another film of aluminum with a similar copper content is formed at a low speed by sputtering to a thickness between 300 and 600 nm, to form a second aluminum layer 35. Referring to the above description, although the term "high speed" used during the formation of the aluminum layers depends on the film forming conditions or design details of the device being fabricated and thus cannot be specified unconditionally, it generally means a sputtering speed of about 10 nm/s or more, whereas a "low speed" means a sputtering speed of 3 nm/s or less.

The aluminum sputtering is performed in the same sputtering apparatus used during the previously described wafer cooling. By carrying out the steps of cooling and aluminum film formation within the same apparatus held under vacuum, the number of substrate movements and placement steps can be reduced, thereby making it possible to simplify the process and to prevent substrate contamination.

In the present embodiment, argon gas is supplied from either the first gas supply line 53 or the second gas supply line 54. The argon gas fed from the second gas supply line 54 is used to control the temperature of the wafer W.

Figure 4:
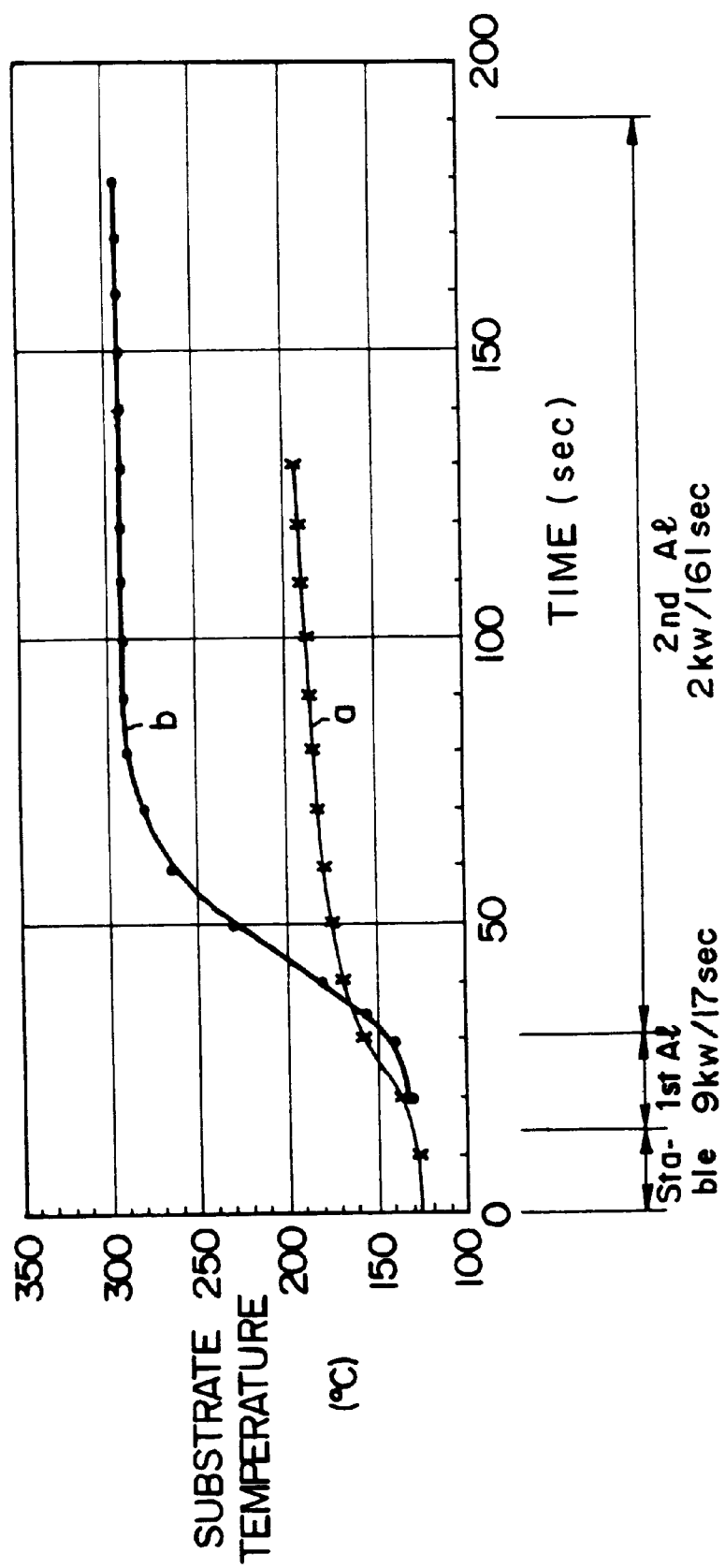
FIG. 4 is a graph showing the relationship between time and substrate temperature, when the substrate temperature is controlled by the sputtering apparatus of FIG. 3A.

An example of the substrate temperature control achieved by using such a sputtering apparatus is shown in FIG. 4. In this graph, elapsed time is plotted along the horizontal axis, and the substrate (wafer) temperature is plotted, along the vertical axis. Reference letter "a" in FIG. 4 denotes the changes in substrate temperature when the temperature of the stage 52 of the sputtering apparatus is set at 350° C. Reference letter "b" denotes the changes in substrate temperature when the temperature of the stage 52 is raised by feeding high-temperature argon through the second gas supply line 54 into the chamber.

The substrate temperature can be controlled as described below, by way of example. First of all, the temperature of the stage 52 is set beforehand to the temperature for forming the second aluminum layer (350° C. to 500° C.). During the formation of the first aluminum layer, there is no supply of gas from the second gas supply line 54, so the substrate is heated by the stage 52 and thus the temperature rises gradually as shown by reference letter "a" in FIG. 4. During the formation of the second aluminum layer, the substrate temperature is controlled by the supply of heated gas through the second gas supply line 54 so that this temperature rises steeply and is held constant at a predetermined level, as shown by reference letter "b" in FIG. 4.

In the example shown in FIG. 4, the stage temperature is set to 350° C., and the first aluminum layer 34 is formed while the substrate temperature is set to between 125° C. and 150° C., and the second aluminum layer 35 is formed immediately afterwards.

During the formation of aluminum layers, controlling the power applied to the sputtering apparatus is important, as is controlling the film-formation speed and the substrate temperature. In other words, with regard to the film formation speed, it is important that the first aluminum layer 34 be formed at a high power and the second aluminum layer 35 be formed at a low power, and at the same time the power must not fall to zero when the power is switched from high to low. If the power falls to zero, an oxide layer will form on the surface of the first aluminum layer even under reduced pressure, causing the wettability of the second aluminum layer to the first aluminum layer to deteriorate and the adhesiveness between them to worsen. In other words, applying power constantly ensures that active aluminum is supplied continuously to the surfaces of the aluminum layers during the film formation, making it possible to suppress the formation of oxide layers. Note that the magnitude of the power depends on factors such as the sputtering apparatus and film-formation conditions, and thus cannot be specified unconditionally. However, it is preferable to set a high power level to a range between 5 kW to 10 kW and a low power level to 300 W to 1 kW under the temperature conditions shown in FIG. 4, by way of example.

By forming the first aluminum layer 34 and the second aluminum layer 35 consecutively within the same chamber in the above described manner, the temperature and power can be controlled more precisely, making it possible to form stable aluminum layers efficiently at a lower temperature than in the conventional art.

Concerning the thickness of the above-mentioned first aluminum layer 34, an optimal range is chosen in consideration of factors such as the capability of forming a continuous layer with good step coverage and also to suppress the release of gaseous components from the barrier layer 33 and the BPSG layer 30 constituting the interlayer dielectric underneath the aluminum layer 34. Accordingly, it is preferable to set the thickness of the first aluminum layer 34 to between 200 and 400 nm, for example. For the second aluminum layer 35, the thickness is determined by such factors as the size and aspect ratio of the contact hole, necessitating a thickness of 300 to 1000 nm, for example, for filling contact holes of 0.5 μm or less in diameter and with an aspect ratio of approximately 3.

<Formation of a reflection prevention layer>

A reflection prevention layer 36 with a thickness of 30 to 80 nm is then formed by depositing TiN in a separate sputtering chamber. Subsequently, the stack consisting of the aforementioned barrier layer 33, the first aluminum layer 34, the second aluminum layer 35, and the reflection prevention layer 36 is selectively etched by an anisotropic dry etcher using $Cl_2$ and $BCl_3$ as the main etchant gases, to pattern a metal wiring layer 40.

It has been confirmed that in the metal wiring layer 40 as prepared in the aforementioned manner, a contact hole of a diameter of 0.2 to 0.8 μm and with an aspect ratio of 0.5 to 3 can be filled with aluminum with good step coverage and without creating any voids.

(D) Next, fabrication steps are described referring to FIG. 2A.

<Formation of a second interlayer dielectric>

As a second interlayer dielectric I2, an interlayer dielectric 60 comprising three layers of silicon oxide is prepared on top of the base structure whereupon the aforementioned first metal wiring layer 40 is formed; i.e. on the first wiring region L1 comprising the substrate 11 on which a MOS transistor is formed, the first interlayer dielectric I1, and the first metal wiring layer 40. The interlayer dielectric 60 comprises a first silicon oxide layer (base layer) 60a having a thickness of 100 to 200 nm grown from a gas phase reaction between a silane compound such as $SiH_4$ or TEOS and a gas comprising oxygen, ozone, $N_2O$ and the like; a second silicon oxide layer 60b having a thickness of 500 to 800 nm formed by a reaction between $SiH_4$ and $H_2O_2$ performed under a reduced pressure of 100 Pa or less, using nitrogen as a carrier; and a third silicon oxide layer 60c having a thickness of 200 to 500 nm formed in the same manner as in the first silicon oxide layer 60a.

The second silicon oxide layer 60b may be formed by having at least one silicon compound, which is chosen from inorganic silane compounds such as monosilane, disilane, $SiH_2Cl_2$, $SiF_4$, and the like, as well as organic silane compounds such as $CH_3SiH_3$, tripropylsilane, tetraethoxysilane, and the like, react with hydrogen peroxide using a low-pressure CVD method carried out at a temperature of no more than 10° C. The second silicon oxide layer 60b has a high fluidity in itself, and therefore provides an excellent self-planarization performance.

<Formation of a via-hole>

Subsequently, the second interlayer dielectric 60 (I2) and the reflection prevention layer 36 are selectively and anisotropically etched with a reactive ion etcher using $CHF_3$ and $CF_4$ as the main gases to provide a via-hole 62 having a diameter of 0.2 to 0.5 μm.

(E) Next, fabrication steps are described referring to FIG. 2B.

<Degassing>

First, the heat treatment that includes a degassing step as a feature of the present invention is described below.

The wafer is subjected to lamp heating (heat treatment D), performed in a lamp chamber for 30 to 60 seconds, at a base pressure of $1 \times 10^{-4}$ Pa or less, and at a temperature of 150° C. to 250° C. Then degassing is performed by heat treatment (degassing step: heat treatment E) for 30 to 120 seconds at a temperature of 300° C. to 550° C. in a separate chamber into which argon is introduced at a pressure of 0.1 to 1.0 Pa.

During the above procedure, the heat treatment D heats the entire wafer, including the rear and side surfaces thereof, to enable the removal of any moisture or the like adhering to the wafer.

The subsequent heat treatment E makes it possible to remove gaseous components (oxygen, hydrogen, water vapor, and nitrogen), mainly from within the second interlayer dielectric I2. As a result, the generation of gaseous components from the interlayer dielectric I2 can be prevented during the subsequent steps of forming the wetting and aluminum layers.

In the present embodiment, since a wetting layer, for example a Ti film, can hold gaseous components (oxygen, hydrogen, water vapor, and nitrogen) dissolved therein, to as much as several atomic percentages, removing the gaseous components from the interlayer dielectric I2 prior to the formation of the wetting layer is extremely effective for forming a good aluminum layer within a via-hole. If the gaseous components in the interlayer dielectric I2 underneath the wetting layer are not removed sufficiently, the gaseous components within the interlayer dielectric I2 will be released during the formation of the wetting layer, and these gases will be taken up into the wetting layer. In addition, these gases will be desorbed from the wetting layer and will exit from the interface with the aluminum layer during the formation of the aluminum layer, which will adversely affect the adhesiveness and fluidity of the aluminum layer.

<Formation of a wetting layer>

As a constituent film of the wetting layer 63, for example, a titanium layer is formed by sputtering to a thickness of 20 to 70 nm. The sputtering temperature preferably is 100° C. or lower, or more preferably 25° C. or lower.

The method of forming the wetting layer 63 has a critical influence over the filling performance of the aluminum layer at the via-hole 62. The reason for this appears to be as follows. The second aluminum layer 65 formed within the via-hole 62 is deposited by a sputtering at a high temperature of 420 to 460° C. If the wetting layer at the upper portion of the via-hole is excessively thick, the material constituting the wetting layer and the aluminum react to produce a chemical compound or an alloy (for example, when the wetting layer comprises titanium, an aluminum-titanium alloy is formed). The upper end of the via-hole is then plugged by such a chemical compound or alloy to cause a condition called "pinch-off", which tends to hinder the aluminum flow into the via-hole, creating a void in the aluminum layer.

To prevent such voids from occurring, it is desirable to form the wetting layer 63 with an ample thickness at and near the bottom of the via-hole 62, and with a reduced thickness at the remaining side-wall and top portions of the via-hole 62. For forming such a wetting layer 63 with a controlled thickness, a collimate sputtering or long-throw sputtering method is preferred. The present inventors have confirmed that by forming a wetting layer in accordance with the aforementioned methods, an excellent aluminum layer can be formed in a via-hole having a diameter of 0.2 μm and an aspect ratio of 3 or higher (3 to 6), without having any pinch-off or voids.

<Heat treatment before formation of aluminum layers>

Prior to the wafer cooling, a heat treatment (heat treatment F) is performed in the lamp chamber for 30 to 60 seconds at a base pressure of $1 \times 10^{-4}$ Pa or less and at a temperature of 150° C. to 250° C. to remove substances such as moisture that may be adhering to the substrate.

<Wafer cooling before formation of aluminum layers>

Before the aluminum layers are formed, the temperature of the substrate is lowered to below 100° C., preferably to between room temperature and 50° C. This cooling step is important for reducing the substrate temperature that has been raised during the sputtering for forming the wetting layer 63.

By cooling the wafer in the above manner, the amount of gas that escapes from the second interlayer dielectric I2, the wetting layer 63, and all the surfaces of the wafer can be minimized during the formation of the first aluminum layer 64. Consequently, the above process can help prevent gases adsorbed in the interface between the wetting layer 63 and the first aluminum layer 64 from adversely affecting the coverage performance and adhesiveness.

The above cooling step is preferably performed by making use of the same sputtering apparatus to be used in the subsequent step of forming the aluminum layers. Further, a sputtering apparatus as shown in FIG. 3A can also be utilized for this cooling step, wherein the cooling is preferably provided in a fashion similar to that in the cooling step carried out before forming the aluminum layer on the surface of the barrier layer, for the same technical reason as described previously. Since such a method makes it possible to reduce the chamber pressure while maintaining the pressure in the space between the wafer W and the electrode 52 high, this provides a good cooling efficiency while preventing contamination of the wafer.

<Formation of aluminum layers>

A film of aluminum containing 0.2 to 1.0 wt. % of copper is first formed at a high speed by sputtering to a thickness of 150 to 300 nm at a temperature no more than 200° C., more preferably 30° C. to 100° C., to provide a first aluminum layer 64. The substrate is then heated within the same chamber to between 420° C. and 460° C., and another film of aluminum with a similar copper content is formed at a low speed by sputtering to a thickness between 300 and 600 nm, to provide a second aluminum layer 65. Referring to the above description, although the term "high speed" used during the formation of the aluminum layers depends on the film forming conditions or design details of the device being fabricated and thus cannot be specified unconditionally, it generally refers to a sputtering speed of about 10 nm/s or more, whereas a "low speed" refers to a sputtering speed of 3 nm/s or less.

The aluminum sputtering is performed in the same sputtering apparatus used during the previously described wafer cooling performed before the formation of the aluminum layer. By carrying out the steps of cooling and the aluminum film formation within the same apparatus, the number of substrate movements and placement steps can be reduced, thereby making it possible to simplify the process and prevent substrate contamination.

In the present embodiment, argon gas is supplied from either the first gas supply line 53 or the second gas supply line 54. The argon gas fed from the second gas supply line 54 is used to control the temperature of the wafer W.

The configuration of the above sputtering apparatus, wafer temperature control, and the power to be applied during the sputtering steps involved are analogous to the steps involved in fabricating the metal wiring layer 40, therefore a detailed description is omitted.

By forming the first aluminum layer 64 and the second aluminum layer 65 consecutively within the same chamber, the temperature and power can be controlled more precisely, making it possible to form stable aluminum layers efficiently at a lower temperature than in the conventional art.

Concerning the thickness of the above-mentioned first aluminum layer 64, an optimal range is chosen in consideration of factors such as the capability of forming a continuous layer with good step coverage and also to suppress the release of gaseous components from the wetting layer 63 and the second interlayer dielectric I2, both underneath the aluminum layer 64. Accordingly, it is preferable to set the thickness of the first aluminum layer 64, for example, at 200 to 400 nm. For the second aluminum layer 65, the thickness is determined by factors such as the size and aspect ratio of the via-hole 62, necessitating a thickness of 300 to 1000 nm, for example, for filling a via-hole of 0.5 $\mu$m or less in diameter and with an aspect ratio of approximately 3.

<Formation of reflection prevention layer>

A reflection prevention layer 66 with a thickness of 30 to 80 nm is then formed by depositing TiN in a separate sputtering chamber. Subsequently, the stack consisting of the aforementioned wetting layer 63, the first aluminum layer 64, the second aluminum layer 65, and the reflection prevention layer 66 is selectively etched by an anisotropic dry etcher using $Cl_2$ and $BCl_3$ as the main etchant gases, to pattern a second metal wiring layer 70.

It has been confirmed that in the second metal wiring layer 70 as prepared in the aforementioned manner, a via-hole of a diameter of 0.2 to 0.8 $\mu$m and with an aspect ratio of 0.5 to 6 can be filled with aluminum with good step coverage and without creating any voids.

From this point on, if necessary, a third, fourth, or further wiring layers can be built by repeating the same process steps taken for fabricating the second wiring region L2.

In accordance with the method described above, a semiconductor device of the present invention (see FIG. 2B) can be fabricated. Such a semiconductor device comprises a silicon substrate 11 that contains a MOS transistor, a first wiring region L1 formed on the silicon substrate 11, and a second wiring region L2 formed on the wiring region L1.

The first wiring region L1 has a first interlayer dielectric I1 comprising a BPSG layer 30, which has had gaseous components removed therefrom by heat treatment, and a silicon oxide layer 20; a contact hole 32 formed in the interlayer dielectric I1; a barrier layer 33 formed on the interlayer dielectric I1 and the contact hole 32; and aluminum layers 34, 35 formed on the barrier layer 33 comprising either aluminum or an alloy in which aluminum is the main component. Further, the aluminum layer 34 is connected to a titanium silicide layer 19 through the barrier layer 33.

The second wiring region L2 has an interlayer dielectric I2 comprising a silicon oxide layer 60 from which gaseous components have been removed by heat treatment; a via-hole 62 formed in the interlayer dielectric I2; a wetting layer 63 formed on the interlayer dielectric I2 and the via-hole 62; and aluminum layers 64, 65 formed on the wetting layer 63 comprising either aluminum or an alloy in which aluminum is the main component.

<Experimental Examples>

Figure 5:
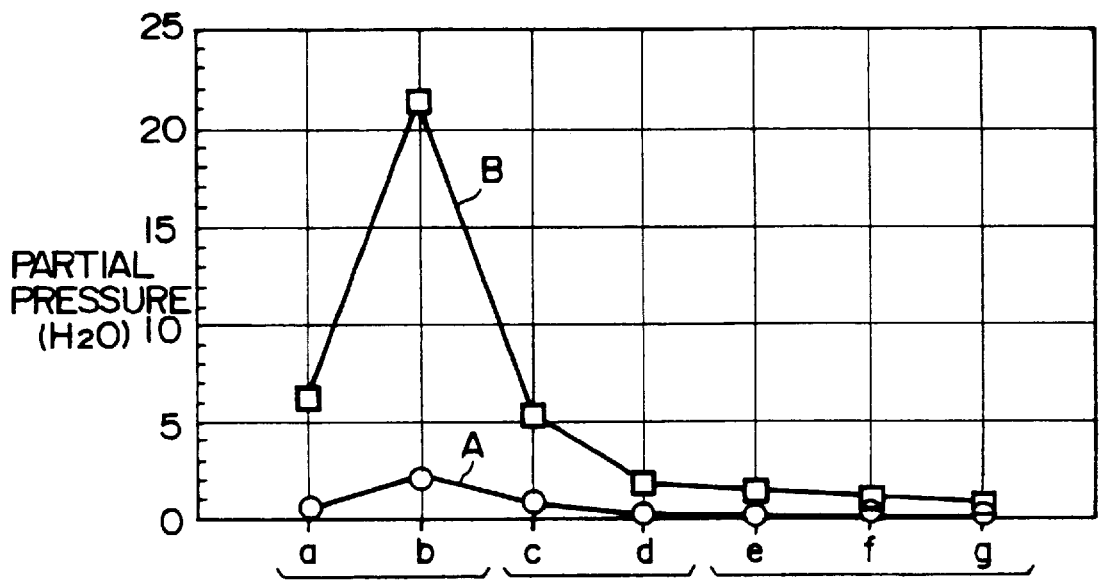
FIG. 5 is a graph showing the relationship between process timing and partial pressure of a gas (water vapor) remaining within the chamber, in the method of fabricating a semiconductor device in accordance with the present invention.
Figure 6:
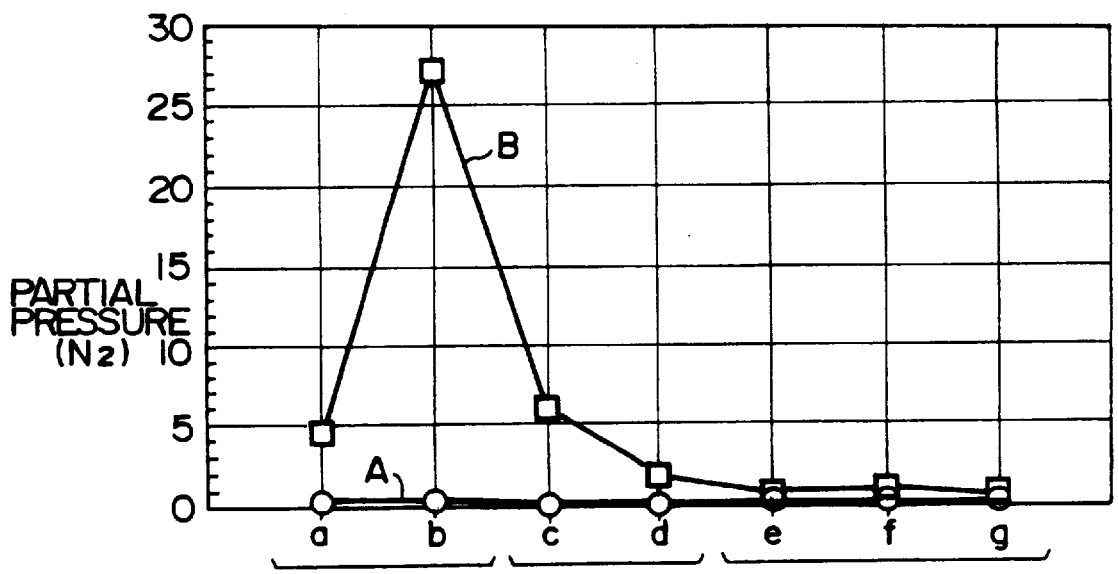
FIG. 6 is a graph of the relationship between process timing and partial pressure of another gas (nitrogen) remaining within the chamber, in the method of fabricating a semiconductor device in accordance with the present invention.

(1) Experiments were performed to investigate differences in the quantity (partial pressure) of gases released from wafers when the second wiring region L2 is formed, both with and without the degassing step, with the results as shown in FIGS. 5 and 6.

In each of FIGS. 5 and 6, the horizontal axis represents the timing of steps from the heat treatment (heat treatment F) performed prior to the formation of the aluminum layers until after the formation of the second aluminum layer 65. The partial pressure of the gas remaining within the chamber is plotted along the vertical axis. In each of these graphs, the lines denoted by the reference letter A represent the results when the degassing step is performed after the formation of the second interlayer dielectric I2. The lines denoted by the reference letter B represent the results when no degassing step is performed after the formation of the second interlayer dielectric I2. In these experimental examples, the degassing step was performed at a pressure of 0.27 Pa and a temperature of 460° C., for duration of 120 seconds.

In each of these graphs, reference letters "a" and "b" on the horizontal axis represent the timing at the heat treatment F (in a first chamber) before the formation of the aluminum layers, where the reference letter "a" is the time immediately after the wafer was placed in the first chamber and the reference letter "b" is the time when the wafer is heated to 250° C. by a lamp for 60 seconds. The pressure within the first chamber was set at $2.7 \times 10^{-6}$ Pa.

Reference letters "c" and "d" represent the timing at the wafer-cooling step (in a second chamber), where the reference letter "c" is the time immediately after the wafer is placed in the second chamber and the reference letter "d" is the time when the temperature of the wafer is cooled to 20° C. The pressure within the second chamber was set at 0.27 Pa. The pressure within this chamber, however, was reduced to $2.7 \times 10^{-6}$ Pa during the measurement of partial pressures.

Reference letters "e", "f", and "g" represent the timing at the steps of forming the aluminum layers (in a third chamber), where the reference letter "e" is the time immediately after the wafer is placed in the third chamber, reference letter "f" is the time immediately after the formation of the first aluminum layer, and the reference letter "g" is the time immediately after the formation of the second aluminum layer. The pressure within the third chamber was set at 0.27 Pa. The pressure within this chamber was reduced to $2.7 \times 10^{-6}$ Pa during the measurement of partial pressures.

It is clear from FIGS. 5 and 6 that the subjecting of a degassing step after the formation of the second interlayer dielectric I2 and before the formation of the wetting layer 63 ensures that essentially no water vapor or nitrogen is generated during the subsequent heat treatment and the formation of the aluminum layers. By contrast, if the above degassing step is not performed, large quantities of both water vapor and nitrogen are emitted during the subsequent heat treatment, particularly during the heat treatment F as indicated by the reference letter "b".

Experimental results almost identical to those shown in FIGS. 5 and 6 have been obtained for the first wiring region L1.

(2) When experiments were performed to investigate whether or not the presence of a wafer-cooling step had any effect on the formation of the aluminum layers, the conclusions described below were obtained. Note that the aluminum layers were formed under conditions of a via-hole aspect ratio of 3.18 and an interlayer dielectric thickness of 1148 nm.

Figure 8A:
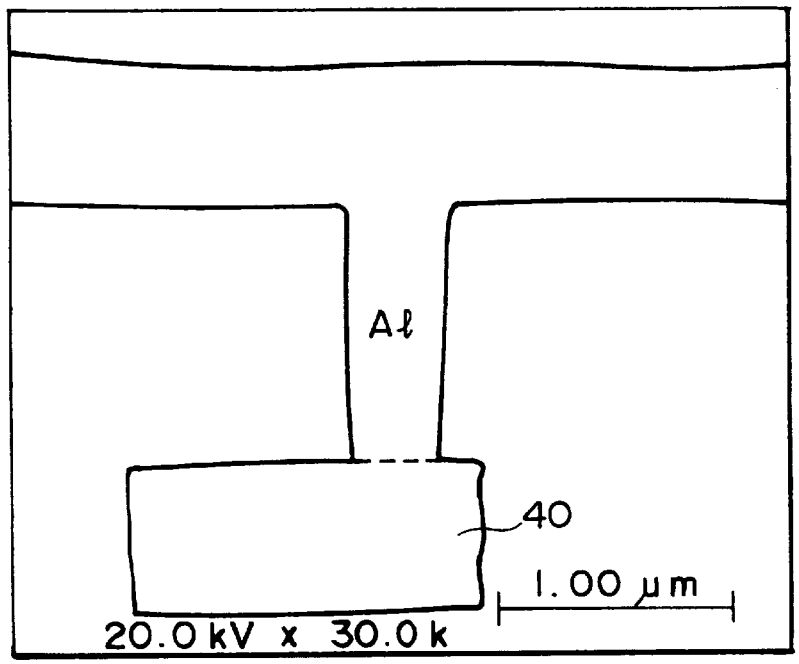
FIG. 8A is a drawing based on an electron micrograph of a cross-section through a wafer in which the aluminum layers are formed after the wafer has been cooled.
Figure 8B:
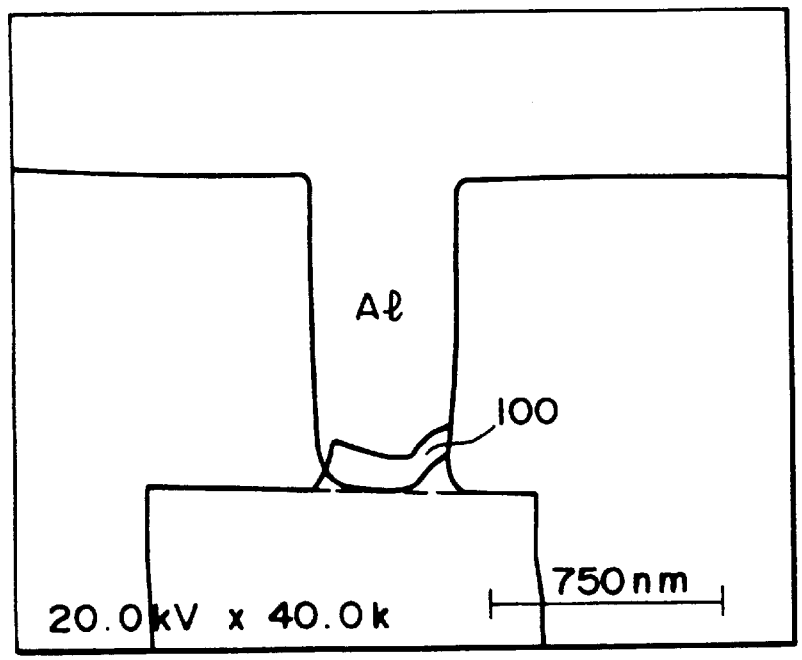
FIG. 8B is a drawing based on an electron micrograph of a cross-section through a wafer in which the aluminum layers are formed without cooling the wafer.

FIG. 8A shows an electron micrograph of a cross-section through a wafer when aluminum layers were formed after the wafer was cooled from the temperature of 120° C. of the heat treatment F to 20° C. FIG. 8B shows an electron micrograph of a cross-section through a wafer when the aluminum layers were formed at the temperature of 120° C. without cooling the wafer.

A comparison was made between the substrate after the formation of the aluminum layers wherein the wafer was cooled and the one wherein the wafer was not cooled. In the case where wafer cooling was provided, as shown in FIG. 8A, it was observed that the first and second aluminum layer filled each via-hole in an extremely favorable manner. By contrast, on a wafer that had not been cooled, approximately 30% of all the via-holes formed in an interlayer dielectric exhibited a lack of complete filling of aluminum to the bottom of the via-holes, where a gap (void) 100 was formed, as shown in FIG. 8B.

In the case when the wafer was adequately cooled (see FIG. 8A), it has been confirmed that there exist an amorphous layer of approximately 20 nm in thickness comprising titanium, silicon, and oxygen, as well as another layer comprising mixed reaction products of $Al_3Ti$ and AlTi, between the second interlayer dielectric and the aluminum layer. Moreover, since the above layer of mixed reaction products contains little to no gaseous components such as water vapor or hydrogen, the layer is formed with tight adhesion to the first metal wiring layer. As a result, the aluminum layers (64, 65) inside via-holes and the first metal wiring layer 40 are connected with a low and stable contact resistance.

By contrast, when the wafer is not cooled (see FIG. 8B), the amorphous layer of titanium, silicon, and oxygen does not exist and a reaction product layer of $Al_3Ti$ is formed in the above location. Such a reaction product layer contains a considerable amount of gaseous components, which are released during the formation of the second aluminum layer to produce voids. Such voids not only increase the contact resistance between the aluminum layers inside the via-holes and the first metal wiring layer, but also cause an electro-migration and stress migration to seriously impair the reliability of the semiconductor device.

Figure 7:
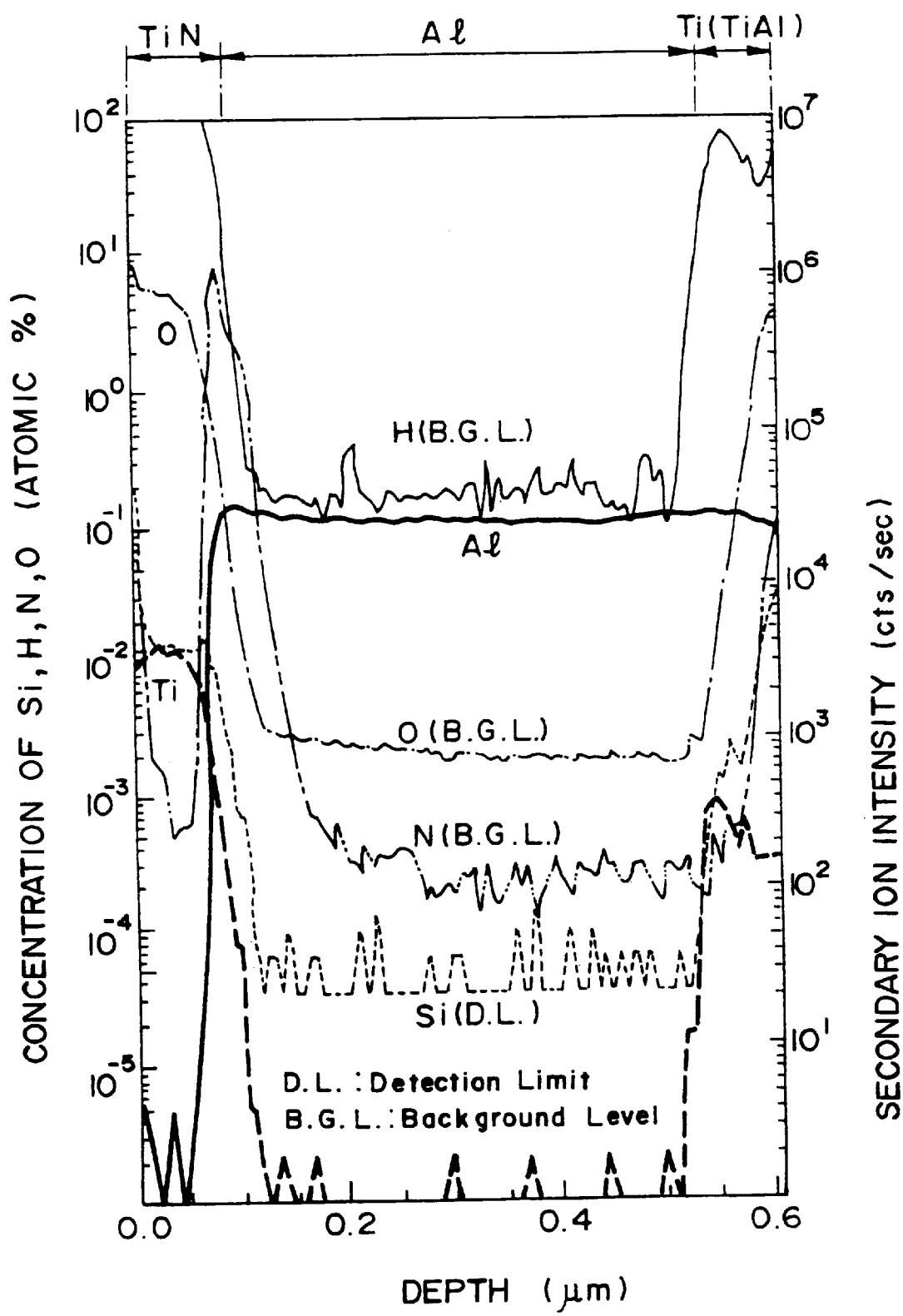
FIG. 7 shows SIMS data obtained for a second metal wiring layer.

(3) FIG. 7 shows the results of measurements obtained by secondary ion mass spectroscopy (SIMS) after the second metal wiring layer 70 with a stacked structure of TiN film/Al film/Ti film was irradiated with cesium primary ions. In FIG. 7, the left-hand vertical axis represents the quantities of silicone, hydrogen, nitrogen, and oxygen in the aluminum layers, and the right-hand vertical axis, the secondary ion intensity in layers other than the aluminum layers.

It was determined from FIG. 7 that the quantities of hydrogen, oxygen, and nitrogen in the aluminum layers were below the minimum detectable concentration for SIMS, which is the background level, meaning that virtually none of these substances were in the solid solution.

For the reasons why the first and second aluminum layers 34 and 35 of the aforementioned embodiment, as well as the first and second aluminum layers 64 and 65 of another embodiment of the present invention each fill the contact holes 32 and via-holes 62 in such a favorable manner, the following can be considered:

(a) The degassing step ensures that any gaseous components such as water vapor or nitrogen that may be contained within the interlayer dielectric I1 and I2, in particular the BPSG layer 30 and the silicon oxides layer 60, are gasified and released therefrom. Such a step helps prevent the generation of gases from the BPSG layer 30 and the barrier layer 33, or the silicon oxides layer 60 and the wetting layer 63, during the subsequent formation of the first aluminum layer 34 and the second aluminum layer 35, as well as the first aluminum layer 64 and the second aluminum layer 65. This makes it possible to increase the adhesiveness between the barrier layer 33 and the first aluminum layer 34 as well as between the wetting layer 63 and the first aluminum layer 64, and thus enables the formation of a layer with good step coverage.

(b) In addition to the effects of the degassing step as above, the adhesiveness of the first aluminum layer 34 to the barrier layer 33, as well as of the first aluminum layer 64 to the wetting layer 63, is further increased by setting the temperature of the substrate to a comparatively low level of 200° C. or lower, during the formation of the first aluminum layer 34 or 64, so that no water vapor or nitrogen can be released from the BPSG layer 30 and the barrier layer 33, as well as from the silicon oxides layer 60 and the wetting layer 63.

(c) Furthermore, the first aluminum layer 34 or 64 itself acts to suppress the generation of gases from underlying layers at an elevated substrate temperature, so that the subsequent formation of the second aluminum layer 35 or 65 can be performed at a comparatively high temperature to ensure that the second aluminum layer will flow and diffuse in a favorable manner.

As described above, in accordance with the present invention, by providing at least a degassing step and a cooling step before the sputtering of the aluminum layers, and preferably by also forming the aluminum layers in sequence within the same chamber, contact holes and via-holes of up to approximately 0.2 μm can be filled with aluminum or aluminum alloy alone, thus improving reliability and yield. It has also been confirmed that there is no segregation of metals such as copper nor any abnormal growth of crystal grains within the aluminum layers that constitute the contact regions, which is also advantageous from the reliability point of view, including migration.

It is to be noted that while the above embodiment has been described with reference to a semiconductor device comprising two-layered wiring regions, it could equally well be applied to a semiconductor device comprising wiring regions of three or more layers. Also, the present invention can be applied not only to the aforementioned n-channel MOS transistor, but it could equally well be applied to semiconductor devices including various elements such as p-channel MOS or CMOS transistors.

What is claimed is:

1. A method of fabricating a semiconductor device comprising a semiconductor substrate including semiconductor elements, and multi-layered wiring regions, wherein at least one layer of the wiring regions above the first wiring region on the semiconductor substrate is fabricated using a process comprising the following steps (a) to (f):

(a) a step of forming a via-hole in an interlayer dielectric formed above the first wiring region on a semiconductor substrate;

(b) a degassing step for removing gaseous components included within said interlayer dielectric by a heat treatment under reduced pressure and at the substrate temperature of 300° C. to 550° C.;

(c) a step of forming a wetting layer on the surface of said interlayer dielectric and said via-hole;

(d) a step of cooling the substrate to a temperature of no more than 100° C.;

(e) a step of forming a first aluminum layer comprising one of aluminum and an alloy in which aluminum is the main component on said wetting layer at a temperature of no more than 200° C.; and (f) a step of forming a second aluminum layer comprising one of aluminum and an alloy in which aluminum is the main component on said first aluminum layer at a temperature of at least 300° C.

2. The method of fabricating a semiconductor device according to claim 1, wherein the formation of the aluminum layers in said steps (e) and (f) is provided by a sputtering method.

3. The method of fabricating a semiconductor device according to claim 1, wherein the formation of the aluminum layers in said steps (e) and (f) is provided in the same chamber and in a consecutive manner.

4. The method of fabricating a semiconductor device according to claim 1, wherein said steps (d), (e), and (f) are performed consecutively in the same equipment having a plurality of chambers each maintained under a reduced pressure.

5. The method of fabricating a semiconductor device according to claim 1, wherein the formation of the aluminum layers in said steps (e) and (f) is provided by controlling the temperature of the stage on which said semiconductor substrate is to be mounted.

* * * * *